(12) United States Patent
Hilsenbeck

(10) Patent No.: US 9,929,244 B2
(45) Date of Patent: Mar. 27, 2018

(54) SEMICONDUCTOR DEVICE AND METHOD FOR PRODUCING A SEMICONDUCTOR DEVICE

(71) Applicant: Infineon Technologies AG, Neubiberg (DE)

(72) Inventor: Jochen Hilsenbeck, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/361,266

(22) Filed: Nov. 25, 2016

(65) Prior Publication Data

US 2017/0154974 A1 Jun. 1, 2017

(30) Foreign Application Priority Data

Nov. 27, 2015 (DE) .................. 10 2015 120 668

(51) Int. Cl.
| | |
|---|---|
| *H01L 29/47* | (2006.01) |
| *H01L 21/285* | (2006.01) |
| *H01L 21/311* | (2006.01) |
| *H01L 23/29* | (2006.01) |
| *H01L 23/31* | (2006.01) |
| *H01L 29/66* | (2006.01) |
| *H01L 29/872* | (2006.01) |

(52) U.S. Cl.
CPC ........ *H01L 29/47* (2013.01); *H01L 21/28537* (2013.01); *H01L 21/31111* (2013.01); *H01L 21/31116* (2013.01); *H01L 21/31144* (2013.01); *H01L 23/291* (2013.01); *H01L 23/3171* (2013.01); *H01L 29/66143* (2013.01); *H01L 29/872* (2013.01); *H01L 23/3192* (2013.01); *H01L 2224/02166* (2013.01); *H01L 2224/05* (2013.01)

(58) Field of Classification Search
CPC ............... H01L 29/47; H01L 21/28537; H01L 21/31111

See application file for complete search history.

(56) References Cited

U.S. PATENT DOCUMENTS

| | | | |
|---|---|---|---|
| 7,851,881 B1 * | 12/2010 | Zhao ................... | H01L 21/0495 257/155 |
| 9,627,552 B2 * | 4/2017 | Richieri ............... | H01L 29/872 |
| 2009/0146191 A1 * | 6/2009 | Green ............... | H01L 21/28587 257/280 |
| 2012/0115319 A1 | 5/2012 | Mieczkowski et al. | |
| 2013/0062723 A1 | 3/2013 | Henning et al. | |
| 2014/0138705 A1 | 5/2014 | Zhang et al. | |

* cited by examiner

*Primary Examiner* — Errol Fernandes
(74) *Attorney, Agent, or Firm* — Murphy, Bilak & Homiller, PLLC

(57) ABSTRACT

A method for producing a semiconductor device includes: depositing a barrier layer on a first surface of a semiconductor body having active regions of a semiconductor device; forming a contact layer that at least partially covers the barrier layer, the barrier layer being configured to prevent a material of the contact layer from diffusing into the semiconductor body; forming a first passivation layer on the contact layer and on exposed surfaces of the barrier layer; in a first etching process, removing the first passivation layer from above the barrier layer so as to uncover sections of the barrier layer; and in a second etching process, removing at least some sections of the barrier layer uncovered by the first etching process

20 Claims, 7 Drawing Sheets

SEMICONDUCTOR DEVICE AND METHOD FOR PRODUCING A SEMICONDUCTOR DEVICE

TECHNICAL FIELD

This disclosure in general relates to a semiconductor device and a method for producing a semiconductor device, and more particularly to a method for producing a semiconductor device with a passivation layer.

BACKGROUND

After forming active device regions of a semiconductor device such as, for example, a diode, a transistor, a thyristor, or the like, in a semiconductor body (die) contact regions are formed, which contact the semiconductor body and allow to connect the semiconductor device to other devices in a circuit. Forming such contact regions may include depositing metallization layers on a surface of the semiconductor body to form conductive pathways. The most common metals used for this purpose are aluminium, or aluminium based alloys. Among several advantages, using an aluminium layer also has some drawbacks. For example, aluminium offers rather limited thermal and mechanical properties. Such disadvantages may be eliminated by using other metals instead of aluminium. Copper, for example, has a comparatively high thermal and electrical conductivity, and provides better contacts between the metallization layer and the bonding wires. Especially in SiC (silicon carbide) power semiconductor devices such as, for example, SiC-Schottky diodes, SiC-JFETs (Junction Field-Effect Transistors) or SiC-MOSFETs (Metal Oxide Semiconductor Field-Effect Transistors) the power cycling reliability may be improved.

To protect the semiconductor surface and the metallization layer from electrical and chemical contaminants or from humidity, for example, a passivation layer is deposited on the semiconductor substrate and on parts of the metallization layer. Those parts of the metallization layer, which are not covered by the passivation layer, can be contacted by bonding wires, for example. The semiconductor body is usually packaged and the package is filled with a mold compound or Silica gels. Most mold compounds and Silica gels, however, do not withstand high electric fields that may occur in the metallization layer. The passivation layer arranged on parts of the metallization layer, therefore, further serves to reduce electrical fields, especially in regions close to the metallization layer, to protect the mold compound. The passivation layer may include an imide. However, there are some materials, which are not compatible when arranged adjacent to each other. Imides, for example, are usually not compatible to copper.

Thus, if copper is used as a metallization layer and an imide is used as a passivation layer, the passivation layer needs to be separated from the metallization layer by a thin intermediate layer. Such an intermediate layer may include a nitride or aluminium oxide, for example. In a first step, the intermediate layer is usually deposited on the whole surface of the semiconductor substrate and of the metallization layer, and is, in a second step, removed from those parts of the semiconductor substrate, which are not covered by the metallization layer. Lots of materials, which may be used for the intermediate layer, however, may only be removed using a dry etch process. When the surface of a semiconductor body such as a SiC semiconductor body, for example, is exposed to a dry etch process, however, areas close to the surface of the semiconductor body may be negatively influenced. For example, impurities may be generated close to the surface, which may be charged or discharged during the operation of the device. This may lead to an unstable blocking behaviour of the device. This again may result in a reduction of the blocking voltage, which may cause a failure of the device.

There is therefore a need for a semiconductor device and a method for producing a semiconductor device with a passivation layer, which prevents a damage of the semiconductor body.

SUMMARY

One example relates to a method. The method comprises depositing a barrier layer on a first surface of a semiconductor body comprising active regions of a semiconductor device. The method further comprises forming a contact layer that at least partially covers the barrier layer, the barrier layer being configured to prevent a material of the contact layer from diffusing into the semiconductor body, and forming a first passivation layer on the contact layer and exposed surfaces of the barrier layer. In a first etching process, the first passivation layer is removed from above the barrier layer so as to uncover sections of the barrier layer and in a second etching process, those sections of the barrier layer are removed, which were uncovered by the first etching process.

Another example relates to a semiconductor device. The semiconductor device includes a barrier layer arranged on a first surface of a semiconductor body which includes active regions of the semiconductor device. A contact layer at least partially covers the barrier layer, the barrier layer being configured to prevent a material of the contact layer from diffusing into the semiconductor body. A first passivation layer is arranged on the contact layer and sections of the barrier layer, and a second passivation layer is arranged on the first passivation layer.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and, by way of illustration, show specific examples in which the invention may be practiced. It is to be understood that the features of the various examples described herein may be combined with each other, unless specifically noted otherwise.

Figure 1:
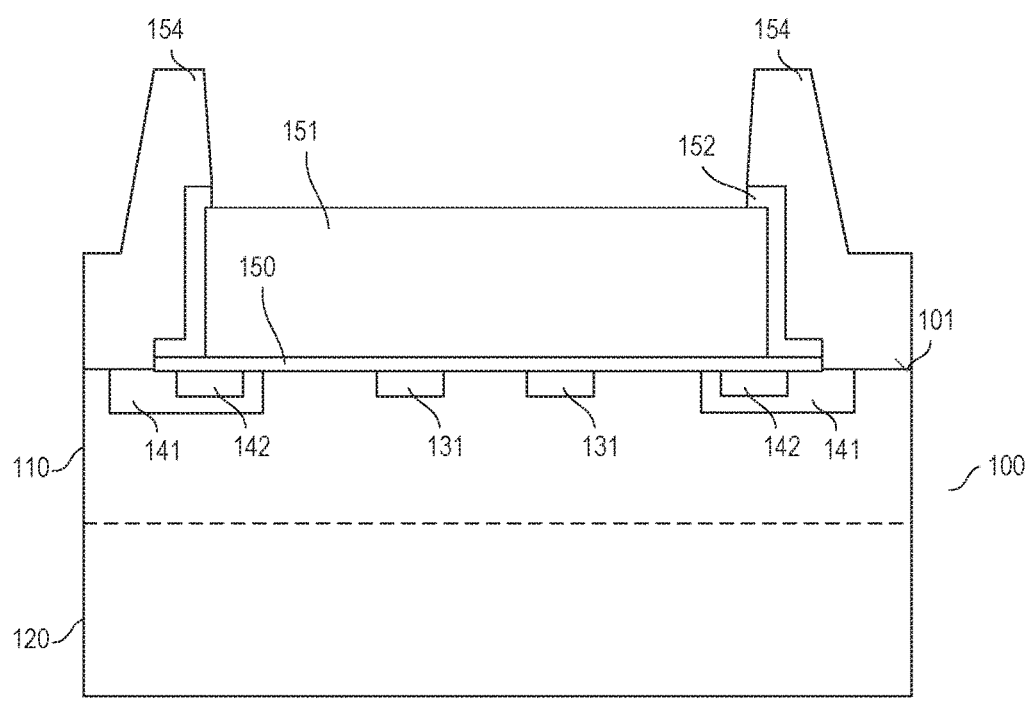
FIG. 1 illustrates one example of a diode in a semiconductor body.

FIG. 1 schematically illustrates a vertical cross sectional view of an MPS (merged-pn Schottky) diode. The MPS diode includes a Schottky contact (metal-semiconductor junction) between a metal layer 150 and a semiconductor body 100. The semiconductor body 100 may include a conventional semiconductor material such as, for example, silicon (Si), silicon carbide (SiC), gallium nitride (GaN), gallium arsenide (GaAs), or the like. The semiconductor body 100 includes differently doped sections. In the example shown in FIG. 1, the semiconductor body 100 includes a first semiconductor region 110 and a second semiconductor region 120, adjoining the first semiconductor region 110. The first semiconductor region 110 and the second semiconductor region 120 may have the same conduction type (doping type) such as an n-type. The first semiconductor region 110 may have a lower doping concentration than the second semiconductor region 120. When Si (silicon) is used as semiconductor material, the doping concentration of the first semiconductor region 110 is, for example, between 1E13 and 1E15 $cm^{-3}$, the doping concentration of the second semiconductor region 120 is, for example, between 1E19 and 1E12 $cm^{-3}$. The doping concentrations may be different for different semiconductor materials. For SiC (silicon carbide), for example, the doping concentration of the first semiconductor region 110 is, for example, between 1E14 and 5E16 $cm^{-3}$ and the doping concentration of the second semiconductor region 120 is, for example, between 1E17 and 1E20 $cm^{-3}$.

The semiconductor body 100 further includes active regions of the MPS diode. The active regions include first border regions 141, extending in a vertical direction from a first surface 101 into the semiconductor body 100. Second border regions 142 may extend in a vertical direction from the first surface 101 into the first border regions 141. The first border regions 141 may have a different conducting type than the first semiconductor region 110 and as the second semiconductor region 120 such as a p-type, for example, and may be configured to form a junction termination edge (JTE). The second border regions 142 may have the same conducting type as the first border regions 141, but may have a higher doping concentration than the first border regions 141. The second border regions 142 may be used to electrically contact the first border regions 141. The doping concentration of the second border regions 142 is, for example, about 1E18 $cm^{-3}$.

Emitter regions 131 extend in a vertical direction from the first surface 101 into the first semiconductor region 110. The emitter regions 131 are arranged in between the first border regions 141. They may have the same conducting type as the second border regions 142 and may have a similar doping concentration. The emitter regions 131 may be configured to inject charge carriers into the first semiconductor region 110 when the forward voltage of the diode is higher than a threshold voltage, thereby forming a merged-pn. Schottky diode configuration.

A metal layer 150 (in the following also referred to as barrier layer) arranged on the first surface 101, to form a Schottky diode, particularly a merged-pn-Schottky (MPS) diode. The metal layer 150 may include a Schottky metal such as molybdenum, molybdenum nitride (MoN), palladium (Pd), platinum (Pt), Vanadium (V) or tungsten (W), for example. The metal layer 150 forms an anode of the diode and the second semiconductor region 120 forms a cathode of the diode. The Schottky contact (Schottky junction) between the metal layer 150 and the semiconductor body 100 is a rectifying contact, that is, a current flow through the Schottky diode is dependent on the polarity of a voltage applied between the anode and the cathode. When the voltage is positive the Schottky junction is forward biased and a current flows when the voltage level reaches a Schottky barrier height of the Schottky junction. When the voltage is negative the Schottky junction is reverse biased and prevents a current flow unless the level of the negative voltage reaches a breakthrough level. However, such breakthrough level is, inter alia, dependent on a doping concentration of the first semiconductor region 110 and a length of the first semiconductor region 110 in a current flow direction and can be up to several 10V or even up to several 100V.

A contact layer 151 is arranged on the metal layer 150. The contact layer 151 forms a so-called front side metallization, which is configured to provide a contact between different devices (e.g. different diodes) arranged within the same semiconductor body 100. In FIG. 1, only one section of one semiconductor body 100 is shown. In this section, only one Schottky diode is included. However, the semiconductor body 100 may include several Schottky diodes as well as other semiconductor devices such as transistors or thyristors, for example. Such devices within one semiconductor body 100 may be connected to each other by means of a contact layer 151. Further, bonding wires may be connected to the contact layer 151, in order to couple different semiconductor bodies, for example. The contact layer 151 may include a metal such as copper, for example. In the past, usually aluminum has been used for the contact layer 151. Using aluminum for the contact layer 151, however, has several drawbacks. Especially with increased demands on performance due to the technology evolution, alternative materials have to be found, which replace the aluminum. Copper offers several advantages over aluminum. For example, copper offers a bulk resistivity of 1.67 μΩcm, whereas aluminum offers a bulk resistivity of only 2.65 μΩcm. Further, the resistance to electromigration property of copper is highly superior to aluminum, which leads to better device reliability.

If a contact layer 151 including copper is arranged adjacent to a semiconductor body 100, copper may easily diffuse into the semiconductor material (e.g. Si, Ge or $SiO_2$) of the semiconductor body 100. This may reduce the device performance, as copper forms deep and shallow level traps in Si and Ge, for example. Copper further reacts with dopants and forms copper-dopant complexes deteriorating device performance. Copper, therefore, should be prevented from diffusing into the semiconductor body 100. To prevent the copper from diffusing into the semiconductor material, usually a barrier layer needs to be provided between the contact layer 151 and the semiconductor body 100. In the given example, the metal layer 150 may function as a barrier layer, preventing the copper from diffusing into the semiconductor body 100. In other semiconductor devices, which inherently do not include any (metal) layer that may function as a barrier layer between the contact layer 151 and the semiconductor body 100, a dedicated barrier layer may be arranged between the contact layer 151 and the semiconductor body 100. Such a barrier layer, alternatively to the Schottky materials already given above, may include titanium (Ti), titanium nitride (TiN), tantalum (Ta), tantalum nitride (TaN), titanium tungsten (TiW) or tungsten silicide ($WSi_2$), for example. Many other materials are known, which may be used within a barrier layer 150.

The primary purpose of a barrier layer 150 is to prevent intermixing of different chemical species with each other. Apart from this primary function, the barrier layer should, for example, be thermodynamically stable with copper and the underlying substrate under standard operating conditions. It should not react with copper or the substrate under thermal, mechanical or electrical stresses encountered during processing steps.

A first passivation layer 152 covers at least parts of the contact layer 151. Generally, after depositing and patterning the contact layer 151 on the semiconductor body 100, a final dielectric layer, in the following referred to as second passivation layer 154, is deposited on parts of the semiconductor body 100 to protect it from damage and contamination. Further, the semiconductor body 100 is usually packaged and the package is filled with a mold compound. Most mold compounds, however, do not stand high electric fields. The second passivation layer 154, therefore, further serves to reduce electrical fields in the boundary areas of the contact layer 151 to shield the mold compound and Silica gel from the electric fields within the semiconductor device. Openings are etched into the second passivation layer 154 to allow access to the top of the contact layer 151 by electrical probes and wire bonds. The second passivation layer 154 may include imide, for example. However, if imide is used for the second passivation layer 154, the second passivation layer 154 may have to be separated from the contact layer 151, as commonly used imide is not compatible with copper. This is because the imide includes a photochemical component, which is blocked by the copper. This means that the imide is rendered photochemically inactive in regions close to the imide-copper junction. The imide may then not adhere to the copper and may be removed inadvertently during structuring. The first passivation layer 152 may further act as an additional humidity protection, for example. The first passivation layer 152 is configured to separate the contact layer 151 and the second passivation layer 154. The first passivation layer 152 may, therefore, cover side surfaces of the contact layer 151 and parts of the top surface of the contact layer 151. The first passivation layer 152 may be a dielectric layer including materials such as nitrides or aluminum oxide ($Al_2O_3$), for example. It is, however, also possible that the first passivation layer 152 is a conductive layer.

The different layers are generally deposited extensively on all exposed surfaces. After deposition they then need to be at least partially removed again in some parts of the semiconductor body 100. The same applies to the barrier layer 150, the contact layer 151, the first passivation layer 152 and the second passivation layer 154. The first passivation layer 152, for example, may be removed in parts of the semiconductor body 100, which are not covered by the contact layer 151. Some materials which may be used for forming the first passivation layer 152, e.g. nitrides or aluminium oxide, however, may only be removed using a dry etching process. Dry etching processes include reactive ion etching (RIE), sputter etching and vapor phase etching, for example. In RIE, for example, the semiconductor body 100 is placed inside a reactor in which several gases are introduced. A plasma is struck in the gas mixture using an RF (radio frequency) power source, breaking the gas molecules into ions. The ions are accelerated towards, and react with the surface of the material being etched (the top surface of the first passivation layer 152).

When using dry etching processes to remove a layer which is arranged adjacent to the semiconductor body 100 on the first surface 101 it is, however, almost impossible to prevent the top surface 101 of the semiconductor body 100 from also being exposed to the dry etching process. When the surface of a semiconductor body 100 including a semiconductor material such as SiC, for example, is exposed to a dry etching process, however, the boundary areas of the semiconductor body 100 close to the first surface 101 may be permanently disturbed. Permanently disturbed in this context means, that unwanted impurities may be generated close to the first surface 101, which may be charged or discharged during the operation of the semiconductor device. This may lead to an unstable blocking behaviour of the device. This again may result in a reduction of the blocking voltage, which may cause a failure of the device.

Therefore, an etch stop layer may be deposited before forming the first passivation layer 152. The etching process will then stop on the etch stop layer. The etch stop layer may be a layer, which may be removed using a different process, e.g. a wet etching process. During a wet etching process a liquid solution dissolves the material in question. To selectively etch the material, an etching mask is required. In contrast to dry etching processes, wet etching processes do not result in damages of the first surface 101. According to the present invention, the barrier layer 150 may function as such an etch stop layer. The barrier layer 150 in a finished semiconductor device does not completely cover the first surface 101. It is only needed in those parts of the semiconductor body 100, in which a contact layer 151 is deposited, to isolate the contact layer 151 from the semiconductor body 100. Therefore, parts of the barrier layer 150 need to be removed after deposition of the barrier layer 150 on the first surface 101. As will be explained by means of FIGS. 2A-2H below, the barrier layer 150 will not immediately be structured, according to the present invention. The barrier layer 150 will only be structured at a later stage, after structuring the first passivation layer 152. In this way, the barrier layer 150 will function as an etch stop layer during structuration of the first passivation layer 152 and an additional etch stop layer will not be needed.

Referring to FIGS. 2A to 2H, a method for producing a semiconductor device is described. Now referring to FIG. 2A, a semiconductor body 100 includes active regions of a semiconductor device such as an MPS (merged-pn Schottky) diode, for example, as has already been described by means of FIG. 1. However, although the semiconductor device shown in FIGS. 1 and 2 is an MPS diode, the method explained herein below is not restricted to be used in processes for manufacturing MPS diodes. The method may be used in the production process of any type of diodes or any type of active devices. Examples of further devices include, but are not restricted to, transistors and thyristors.

Figure 2A:
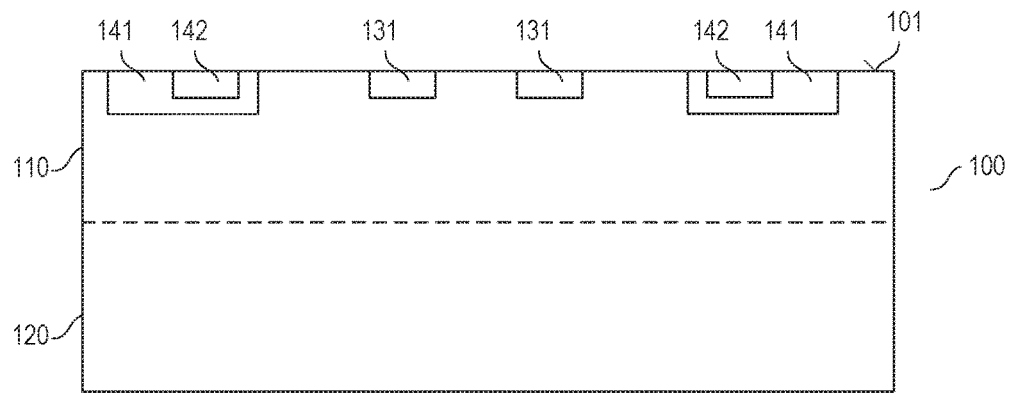
FIGS. 2A-2H illustrate one example of a method for producing a semiconductor device according to the present invention.
Figure 2B:
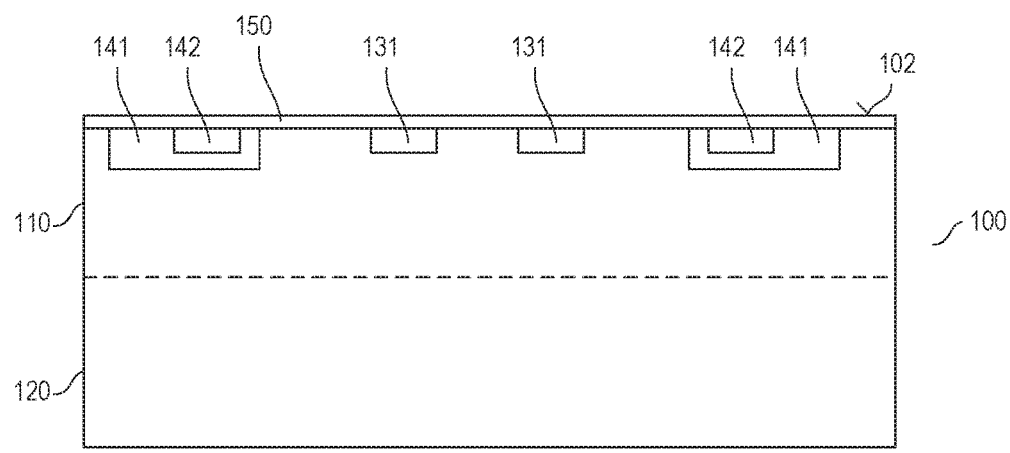

Referring to FIG. 2B, a barrier layer 150 is formed on the first surface 101 of the semiconductor body 100. Different techniques may be used to deposit the barrier layer 150. For the deposition of metal based layers, usually physical vapor deposition (PVD) is used. During PVD a target of the respective metal is sputtered on the surface of the semiconductor body 100. This, however, is only an example. Further methods which may be used for the deposition of the barrier layer 150 include chemical vapor deposition (CVD), atomic layer deposition (ALD), Ionized PVD (I-PVD), hollow cathode PVD and Low Pressure Long Throw PVD.

Figure 2C:
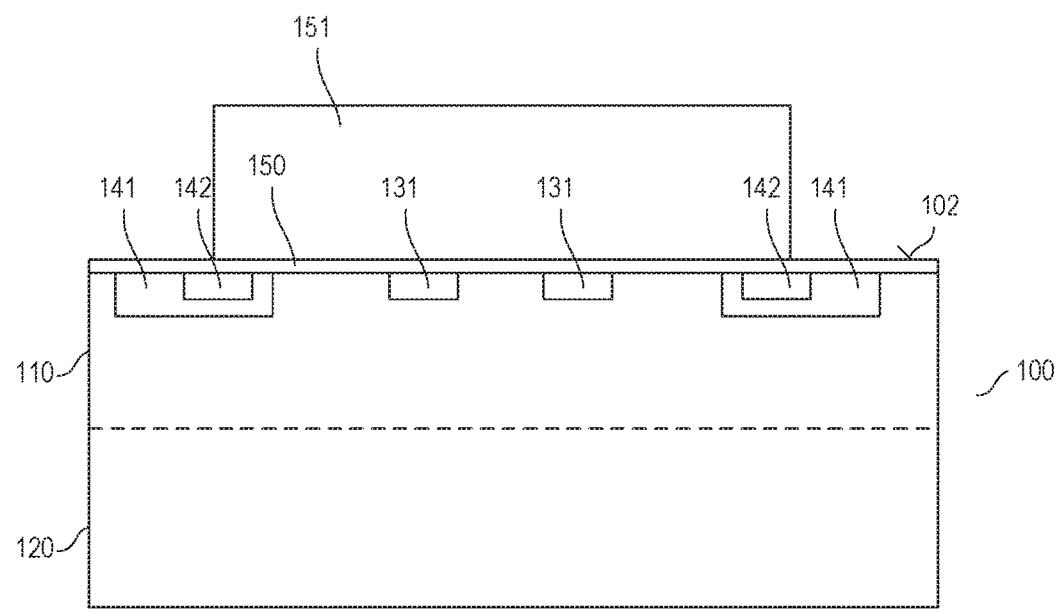

Now referring to FIG. 2C, a contact layer 151 is formed adjacent to the barrier layer 151. The contact layer 151 may be a metal layer including a metal such as copper, for example. The contact layer 151 may be deposited using a sputtering process, electrochemical deposition, chemical vapor deposition (CVD) or physical vapor deposition (PVD), for example. After deposition, the contact layer 151 usually covers the whole surface 102 of the barrier layer 150. To form defined copper lines, which connect different semiconductor devices, the layer needs to be structured. Usually, a photo resist layer (not illustrated in FIG. 2C) is deposited on the contact layer. The steps of exposure and development follow the deposition of the photoresist layer.

The resist mask is then transferred into the contact layer beneath the photoresist layer via a dry etch or wet etch process, before removing the photoresist layer. Other processes for deposition of a contact layer, in particular copper layers, include the so-called Damascene process. Such processes are known in the art and will, therefore, not be described in further detail.

Figure 2D:
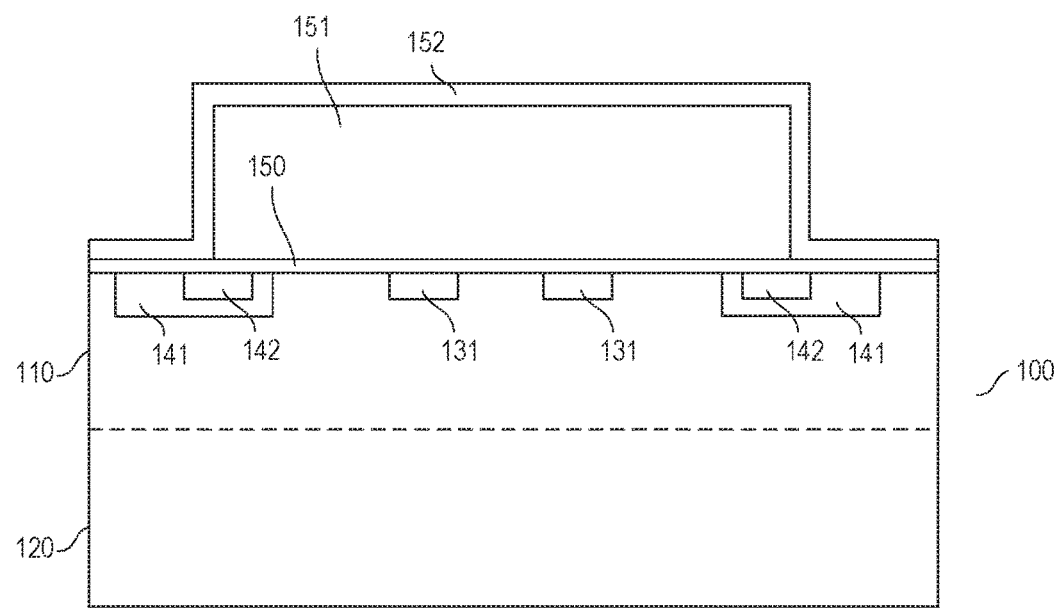

Referring to FIG. 2D, a first passivation layer 152 is then formed on the semiconductor body 100. The first passivation layer 152 covers the top surface and side surfaces of the contact layer 151 as well as those parts of the top surface 103 of the barrier layer 150, which are not covered by the contact layer 151. The first passivation layer 152 may be a dielectric layer, for example. It is, however, also possible that the first passivation layer 152 is an electrically conducting layer. The first passivation layer 152 may be deposited using an atomic layer deposition (ALD), chemical vapor deposition (CVD) or physical vapor deposition (PVD), for example. ALD is a nanotechnology, which allows ultra-thin films to be deposited in a precisely controlled way.

Figure 2E:
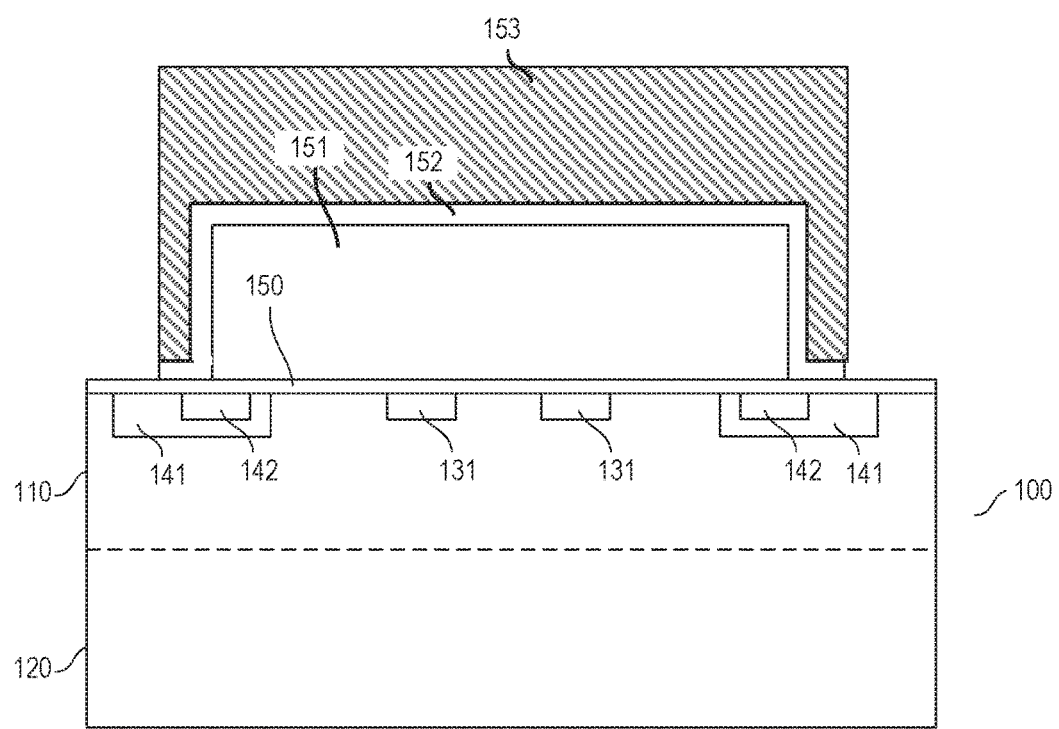

The first passivation layer 152 is configured to separate the contact layer 151 from the second passivation layer 154, which will be deposited at a later stage of the process. The first passivation layer 152, therefore, may be removed from those parts of the semiconductor body 100, which will not be covered by the second passivation layer 154. Referring to FIG. 2E, in a next step the first passivation layer 152 may be structured. One possibility to structure the passivation layer 152 is to deposit a photoresist layer 153 on the top surface of the first passivation layer 152. Such a photoresist layer 153 (after structuring) is designated in FIG. 2E with hatched shading. The photoresist layer 153 after structuring may, for example, cover the side portions and the top portion of the contact layer 151, or to say of the first passivation layer 152, which again covers the side portions and the top portion of the contact layer 151. The first passivation layer 152 may then be removed using any suitable process, e.g. a dry etching or a wet etching process. As the barrier layer 150, which is arranged between the first passivation layer 152 and the semiconductor body 100, functions as an etch stop layer, a dry etching process may be used without potentially damaging the first surface 101 of the semiconductor body 100. Once the first passivation layer 152 is removed to uncover sections of the barrier layer 150, the process may not stop immediately. Therefore, also the barrier layer 150 may be partly removed (so-called over etching). The etching time, therefore, may be chosen such that at least a thin film of the barrier layer 150 remains, which protects the first surface 101 from any etching process, in particular a dry etching process.

As has already been explained above by means of FIG. 1, several different materials may be used for forming the first passivation layer 152. Some materials may be removed using wet etching processes, for example. A wet etching process, for example, may be used on any semiconductor material. However, some materials may only be removed using a dry etching process, e.g. SiN or TiN. A dry etching process, however, may result in permanent damages when applied on certain semiconductor materials (e.g. SiC). As the barrier layer 150 functions as an etch stop layer, any material and any process, even dry etching processes, may be used for removing the first passivation layer 152 in a first etching process. Therefore, there are no restrictions for choosing the material of the first passivation layer 152 and for choosing the process for removing the first passivation layer 152.

Figure 2F:
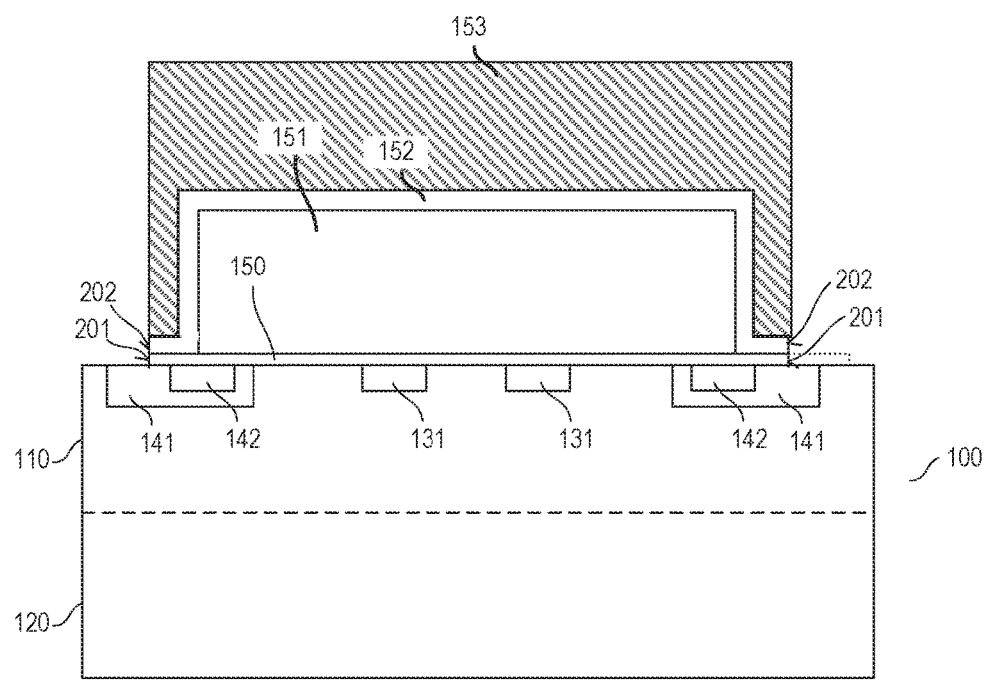

Now referring to FIG. 2F, in a second etching process the barrier layer 150 is removed in at least some sections, which have been uncovered during the first etching process. In a first example, as is illustrated in FIG. 2F, the barrier layer 150 is removed in all sections, which have been uncovered during the first etching process. This means, that the side surfaces 201 of the barrier layer 150 are essentially aligned with the side surfaces 202 of the first passivation layer 152 and the harrier layer 150 is substantially completely covered by the first passivation layer 152. This is, however, only an example. In another example, the barrier layer 150 may only be removed in some sections, which have been uncovered by the first etching process. In this example some sections of the barrier layer 150, therefore, are not covered by the first passivation layer 152. For example, the barrier layer 150 may extend beyond the first passivation layer 152. This is exemplarily illustrated in dotted lines in FIG. 2F.

For removing the barrier layer 150, a wet etching process may be used, for example. This is, however, only an example. Any other suitable process may be used, which does not result in damages of the semiconductor body 100 when the barrier layer 150 is removed in the desired sections and the process reaches the first surface 101. If the semiconductor body 100 includes silicon carbide (SiC), for example, a dry etching process should not be used to remove the barrier layer 150, as has already been described above.

Once the first passivation layer 152 and the barrier layer 150 have been removed, the photoresist layer 153 (if applicable) may also be removed. Photoresist may be removed using a so-called liquid resist stripper, for example, which chemically alters the photoresist so that it no longer adheres to the semiconductor body 100. Other methods for removing the photoresist layer 153 include oxidation of the photoresist using a plasma containing oxygen (so-called asking). These are, however, only examples. Any other suitable method may be used to remove a photoresist layer 153.

Figure 2G:
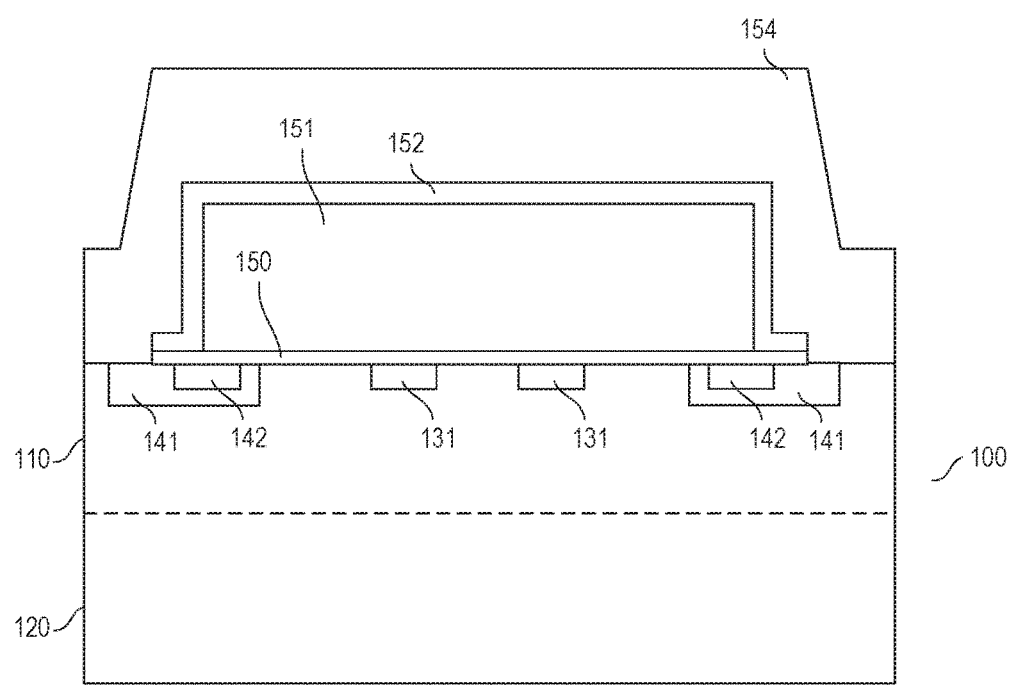
Figure 2H:
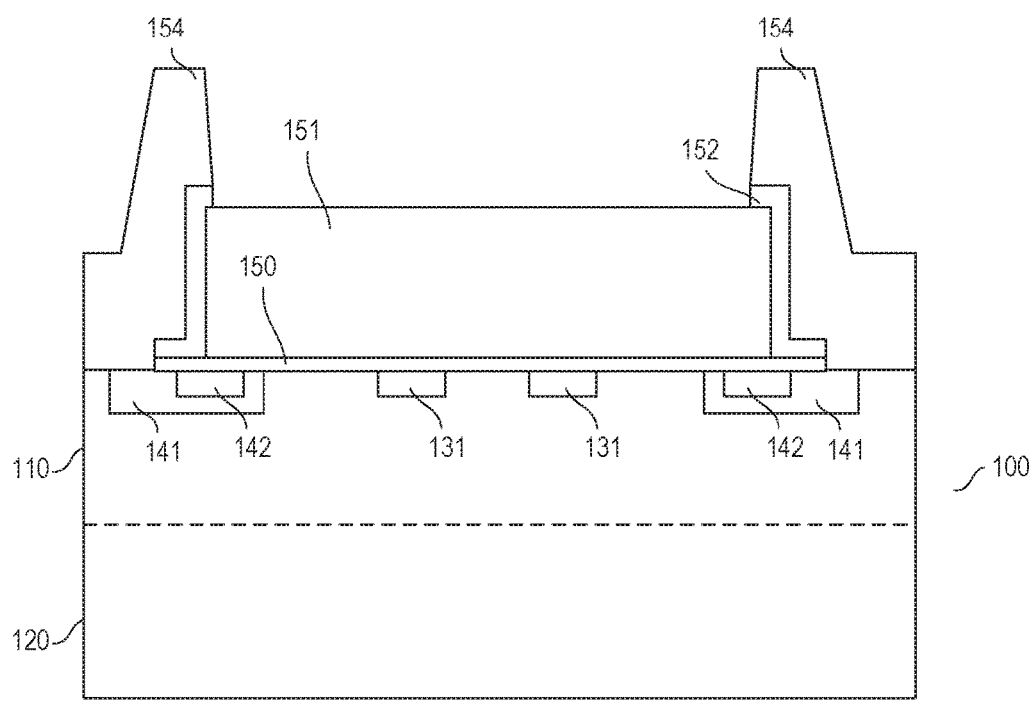

In a further step, a second passivation layer 154 may be formed, as is illustrated in FIG. 2G. The second passivation layer 154 is configured to separate the contact layer 151 from a molding material, which will later enclose the semiconductor body 100 when placed in a package (not illustrated in FIG. 2G). The second passivation layer may be a continuous layer, at least covering the first passivation layer 152 and parts of the first semiconductor region 110. The second passivation layer 154 may include imide, for example. The second passivation layer 154 may be deposited using an atomic layer deposition (ALD), chemical vapor deposition (CVD) or physical vapor deposition (PVD), for example Referring to FIG. 2H, contact holes may be formed, which allow the contact region 151 to be contacted through bonding wires. Therefore, the second passivation layer 154 and the first passivation layer 152 may be structured, for example by means of an appropriate etching mask (not illustrated in FIG. 2H). During a further etching process, the second passivation layer 154 and the first passivation layer 152 may be partially removed so as to uncover sections of the contact region 151, which are later contacted, e.g. through bonding wires. For removing the second passivation layer 154 and the first passivation layer 152, the same processes as have been described above may be used, e.g. dry or wet etching processes.

Although the figures only show one section of one semiconductor body 100, the process steps explained with reference to FIGS. 2A to 2H, can be applied at once to a plurality of semiconductor bodies that are part of a semiconductor wafer. That is, these process steps can be applied to a semiconductor wafer, which includes a plurality of semiconductor bodies, wherein the semiconductor wafer can be subdivided into the plurality of semiconductor bodies (dies) at the end of the manufacturing process. According to another example, one wafer includes (is comprised of) only one semiconductor body.

By the method explained herein before, any material may be used for forming the insulation layer, irrespective of the method for removing the insulation layer on parts of the semiconductor body. The semiconductor body, at all times, is protected from potentially destructive methods used to remove the insulation layer, as the barrier layer not only acts as a barrier between the contact region and the semiconductor material, but also acts as an etch stop layer.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
    depositing a barrier layer on a first surface of a semiconductor body comprising active regions of a semiconductor device;
    forming a contact layer that at least partially covers the barrier layer, the barrier layer being configured to prevent a material of the contact layer from diffusing into the semiconductor body;
    forming a first passivation layer on the contact layer and on exposed surfaces of the barrier layer;
    in a first etching process, removing the first passivation layer from above the barrier layer so as to uncover sections of the barrier layer; and
    in a second etching process, removing at least some sections of the barrier layer uncovered by the first etching process.

2. The method of claim 1, wherein the barrier layer is further configured to serve as an etch stop layer during the first etching process, to prevent the semiconductor body from being exposed to the first etching process.

3. The method of claim 1, wherein the first etching process further comprises:
    forming an etching mask on the first passivation layer at least above the contact layer; and
    removing the first passivation layer in those sections not covered by the etching mask.

4. The method of claim 3, wherein the etching mask also covers sections of the first passivation layer adjoining the barrier layer.

5. The method of claim 3, wherein the second etching process further comprises etching the barrier layer using the etching mask.

6. The method of claim 3, wherein the etching mask comprises a photoresist.

7. The method of claim 1, further comprising:
    forming a second passivation layer on the first passivation layer and the first surface of the semiconductor body; and
    forming a contact opening in the first passivation layer and the second passivation layer above the contact layer.

8. The method of claim 1, wherein the first etching process comprises a dry etching process.

9. The method of claim 1, wherein the second etching process comprises a wet etching process.

10. The method of claim 1, wherein the contact layer comprises copper.

11. The method of claim 1, wherein the barrier layer comprises at least one of molybdenum, molybdenum nitride, palladium, platinum, vanadium, tungsten, titanium, titanium nitride, tantalum, tantalum nitride, titanium tungsten and tungsten silicide.

12. The method of claim 1, wherein the first passivation layer comprises at least one of a nitride and an oxide.

13. The method of claim 12, wherein the oxide is aluminum oxide.

14. The method of claim 7, wherein the second passivation layer comprises an imide.

15. A semiconductor device, comprising:
    a barrier layer arranged on a first surface of a semiconductor body comprising active regions of the semiconductor device;
    a contact layer at least partially covering the barrier layer, the barrier layer being configured to prevent a material of the contact layer from diffusing into the semiconductor body;
    a first passivation layer arranged vertically along sidewalls of the contact layer and horizontally on sections of the barrier layer not covered by the contact layer, so that the first passivation layer is separated from the semiconductor body by the sections of the barrier layer not covered by the contact layer; and
    a second passivation layer in contact with a top surface of the first passivation layer.

16. The semiconductor device of claim 15, wherein the contact layer comprises copper.

17. The semiconductor device of claim 15, wherein the barrier layer comprises at least one of molybdenum, molybdenum nitride, palladium, platinum, vanadium, tungsten, titanium, titanium nitride, tantalum, tantalum nitride, titanium tungsten and tungsten silicide.

18. The semiconductor device of claim 15, wherein the first passivation layer comprises at least one of a nitride and an oxide.

19. The semiconductor device of claim 18, wherein the oxide is aluminum oxide.

20. The semiconductor device of claim 18, wherein the second passivation layer contacts sections of the semiconductor body not covered by the barrier layer, the contact layer and the first passivation layer.

* * * * *